United States Patent
Wu et al.

(10) Patent No.: US 12,486,590 B2
(45) Date of Patent: Dec. 2, 2025

(54) SUBSTRATE PROCESSING METHOD

(71) Applicant: ACM RESEARCH (SHANGHAI), INC., Shanghai (CN)

(72) Inventors: Meng Wu, Shanghai (CN); Chenhua Lu, Shanghai (CN); Zhaowei Jia, Shanghai (CN); Quan Cao, Shanghai (CN); Jian Wang, Shanghai (CN); Hui Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 96 days.

(21) Appl. No.: 18/690,685

(22) PCT Filed: Jul. 25, 2022

(86) PCT No.: PCT/CN2022/107507
§ 371 (c)(1),
(2) Date: Mar. 8, 2024

(87) PCT Pub. No.: WO2023/035790
PCT Pub. Date: Mar. 16, 2023

(65) Prior Publication Data
US 2024/0376625 A1    Nov. 14, 2024

(30) Foreign Application Priority Data
Sep. 8, 2021   (CN) .......................... 202111050183.4

(51) Int. Cl.
*C25D 5/34*   (2006.01)
*C25D 5/10*   (2006.01)
(Continued)

(52) U.S. Cl.
CPC .................. *C25D 5/34* (2013.01); *C25D 5/10* (2013.01); *C25D 5/54* (2013.01); *C25D 17/06* (2013.01); *H01L 21/288* (2013.01)

(58) Field of Classification Search
None
See application file for complete search history.

(56) References Cited

U.S. PATENT DOCUMENTS 7,323,058 B2 * 1/2008 Lubomirsky ....... H01L 21/6719
257/E21.174
8,703,546 B2 * 4/2014 Lin ........................ C25D 7/123
438/129
(Continued)

FOREIGN PATENT DOCUMENTS

CN    1317825 A    10/2001
CN    1981070 A    6/2007
(Continued)

OTHER PUBLICATIONS

International Search Report issued in Application No. PCT/CN2022/107507, mailed on Oct. 9, 2022 (5 pages).
(Continued)

*Primary Examiner* — Wojciech Haske
(74) *Attorney, Agent, or Firm* — Osha Bergman Watanabe & Burton LLP

(57) ABSTRACT

Disclosed is a substrate processing method, which comprises the following steps: S1: transferring a substrate plated with a first metal layer from a first plating chamber to a second plating chamber; S2: after transferring the substrate to the second plating chamber, forming a water film layer on the front side of the substrate; S3: electroplating a second metal layer on the first metal layer. By means of a step of forming a water film layer before electroplating in a plating chamber, the present invention has advantages of preventing delamination between two metal layers and solving product recess abnormality.

9 Claims, 6 Drawing Sheets

(51) Int. Cl.
     *C25D 5/54*           (2006.01)
     *C25D 17/06*         (2006.01)
     *H01L 21/288*       (2006.01)

(56) References Cited

U.S. PATENT DOCUMENTS

| | | | |
|---|---|---|---|
| 2015/0206767 A1* | 7/2015 | Murakami | H01L 24/742 |
| | | | 438/612 |
| 2020/0105593 A1 | 4/2020 | Wu et al. | |

FOREIGN PATENT DOCUMENTS

| CN | 102254842 A | 11/2011 |
|---|---|---|
| CN | 104846410 A | 8/2015 |
| CN | 207567373 U | 7/2018 |

OTHER PUBLICATIONS

Written Opinion issued in Application No. PCT/CN2022/107507, mailed on Oct. 9, 2022 (6 pages).

\* cited by examiner

SUBSTRATE PROCESSING METHOD

1. FIELD OF THE INVENTION

The present invention generally relates to the field of semiconductor plating technology, and more particularly relates to a substrate processing method.

2. THE RELATED ART

In the field of semiconductor manufacturing, metal layers are usually prepared by an electroplating process. For example, after the metal seed layer is formed on the wafer through processes such as chemical vapor deposition and sputtering, the photolithography process is performed: coating photoresist, exposure, developing to form a pattern that reveals the metal seed layer, and then electroplating process is performed to form metal layers, such as the formation of a copper layer, a nickel layer, and a gold layer in turn. In the electroplating process, due to the thickness of the photoresist and the opening size of the pattern, there is a pre-wetting process before electroplating, and the purpose is to make the pattern be filled with water, so that when the substrate is in contact with the electroplating solution, the electroplating solution can enter the pattern more smoothly, to improve the ion transfer efficiency.

The pre-wetting process is usually carried out before copper plating, and package electroplating requires plating different metal layers in different plating chambers, so the substrate has to go through several transfers, during which the water is easy to evaporate and be lost.

For example, when plating nickel after copper plating, if the moisture on the surface of the substrate and the pattern evaporates and dries up, it will cause the electroplating solution for nickel plating to be difficult to enter the pattern, which will lead to delamination between the nickel layer and the copper layer, resulting in product defects.

SUMMARY

An object of the present invention is to solve the problem in the prior art in which delamination occurs between different plated metal layers, resulting in product defects.

In order to realize the above purpose, the present invention proposes a substrate processing method, comprising the following steps:
  S1: transferring a substrate plated with a first metal layer from a first plating chamber to a second plating chamber;
  S2: after transferring the substrate to the second plating chamber, forming a water film layer on the front side of the substrate;
  S3: electroplating a second metal layer on the first metal layer.

By adopting the above technical solution, after the substrate enters the second plating chamber, a water film layer is firstly formed on the front side of the substrate plated with the first metal layer to eliminate the influence caused by the evaporation of moisture on the surface of the substrate during the substrate transfer process, and then the second metal layer is electroplated on the upper surface of the first metal layer. At this time, the electroplating solution of the second metal layer is able to enter the pattern smoothly and fully contact with the first metal layer, and delamination between the second metal layer and the first metal layer is avoided. Therefore, the substrate processing method has the advantage of avoiding delamination between two metal layers and solving product recess abnormality through the step of forming a water film layer before electroplating.

In addition, in the above technical solution, the water film layer is formed on the front side of the substrate after the substrate enters the second plating chamber so the substrate isn't pre-wetted in an additional pre-wetting chamber, and thus the process step of transferring the substrate from the pre-wetting chamber to the second plating chamber can be omitted, which is capable of saving the equipment space, shortening the process waiting time, and improving the production efficiency.

Further, the step S2 in the substrate processing method proposed in the present invention comprises:
  S21: using a substrate chuck to clamp the substrate and bring the substrate to rotate, and using a spray device in the second plating chamber to spray water film forming liquid on the front side of the substrate to form the water film layer, and setting the rotation speed of the substrate chuck and the spray time and spray flow rate of the spray device;
  S22: making the substrate rotate according to the set rotation speed, and at the same time, the spray device in the second plating chamber sprays the water film forming liquid on the front side of the substrate according to the set spray time and spray flow rate, so as to form the water film layer.

By adopting the above technical solution, the spray device in the second plating chamber is used to spray the water film forming liquid on the front side of the substrate according to the preset spray time and spray flow rate. On the one hand, the electroplating solution residue of the previous electroplating process on the front side of the substrate can be cleaned to prevent cross-contamination; on the other hand, the formation of the water film layer can prevent the front side of the substrate from drying before electroplating, and eliminate the adverse effects of water evaporation on the electroplating process. By setting the corresponding spray flow rate, the flow rate can avoid being too small, which results in the electroplating solution residue on the front side of the substrate not being cleaned, resulting in cross-contamination; at the same time, it also avoids that the flow rate is too large, resulting in not easy to form a uniform water film. By setting the corresponding rotation speed, it avoids that the substrate rotation speed is too small, resulting in a large amount of falling water; and it also avoids that the rotation speed is too large, which will dry up the moisture on the surface of the substrate, which is not conducive to the formation of the water film layer.

Further, the shape of the water film forming liquid sprayed by the spray device is fan-shaped, and the water film forming liquid is deionized water.

By adopting the above technical solution, it can make the water film forming liquid uniformly cover the surface of the substrate.

Further, the step S1 in the substrate processing method proposed in the present invention comprises:
  S11: placing the substrate in the first plating chamber to electroplate the first metal layer on the front side of the substrate, wherein the front side of the substrate faces down;
  S12: taking the substrate from the first plating chamber, and keeping the front side of the substrate facing down until the substrate is transferred to the second plating chamber.

By adopting the above technical solution, the existing substrate transfer method is improved, and during the substrate transfer process from the first plating chamber to the second plating chamber, the front direction of the substrate is always kept unchanged, thereby shortening the time that the substrate is transferred from the first plating chamber to the second plating chamber, which has the advantages of saving time and improving production efficiency.

Further, the above step S11 comprises:

S101: after transferring the substrate to the first plating chamber, selecting whether it is necessary to spray water film forming liquid from a spray device in the first plating chamber to the front side of the substrate, if necessary, spraying the water film forming liquid to the front side of the substrate via the spray device in the first plating chamber, and then entering step S102, if not necessary, directly entering the step S102;

S102: electroplating the first metal layer on the front side of the substrate.

By adopting the above technical solution, a better electroplating effect can be ensured by selecting whether or not the water film forming liquid needs to be sprayed to the front side of the substrate by the spray device in the first plating chamber according to the actual process requirements.

Further, the substrate processing method proposed by the present invention further comprises the following steps before the step S1:

S01: taking the substrate from a temporary storage area with the front side of the substrate facing up;

S02: transferring the substrate toward the first plating chamber, and changing the front side of the substrate from facing up to facing down during the substrate transfer process.

By adopting the above technical solution, during the transfer process of the substrate from the temporary storage area to the first plating chamber, a transfer method of flipping while transferring is adopted, effectively reducing the time required for the substrate to transfer from the temporary storage area to the first plating chamber (Q-time).

Further, the substrate processing method proposed in the present invention, further comprises the following steps:

S4: taking the substrate from the second plating chamber, and keeping the front side of the substrate facing down until the substrate is transferred to a third plating chamber;

S5: electroplating a third metal layer on the second metal layer after the substrate is transferred to the third plating chamber.

The above technical solution is adopted to improve the existing substrate transfer method, so that during the transfer process of the substrate from the second plating chamber to the third plating chamber, the front direction of the substrate is always kept unchanged, effectively reducing the time (Q-time) required for the substrate to transfer from the second plating chamber to the third plating chamber.

Further, the above step S5 comprises:

S501: after transferring the substrate to the third plating chamber, selecting whether it is necessary to spray water film forming liquid from a spray device in the third plating chamber to the front side of the substrate, if necessary, spraying the water film forming liquid to the front side of the substrate through the spray device in the third plating chamber, and then entering step S502, if not necessary, directly entering the step S502;

S502: electroplating the third metal layer on the second metal layer.

Further, the substrate processing method proposed in the present invention, further comprises the following steps:

S6: taking the substrate from the third plating chamber, with the front side of the substrate facing down;

S7: transferring the substrate to a cleaning chamber, and changing the front side of the substrate from facing down to facing up during the transfer process;

S8: cleaning and drying the substrate in the cleaning chamber.

By adopting the above technical solution, during the transfer process of the substrate from the third plating chamber to the cleaning chamber, a transfer method of flipping while transferring is adopted, which effectively shortens the time (Q-time) required for the substrate to transfer from the third plating chamber to the cleaning chamber, and has the advantage of improving production capacity.

Other features and corresponding beneficial effects of the present invention are explained in the following part of the specification, and it should be understood that at least part of the beneficial effects become obvious from the description in the specification of the present invention.

DETAILED DESCRIPTION OF EMBODIMENTS

Figure 1:
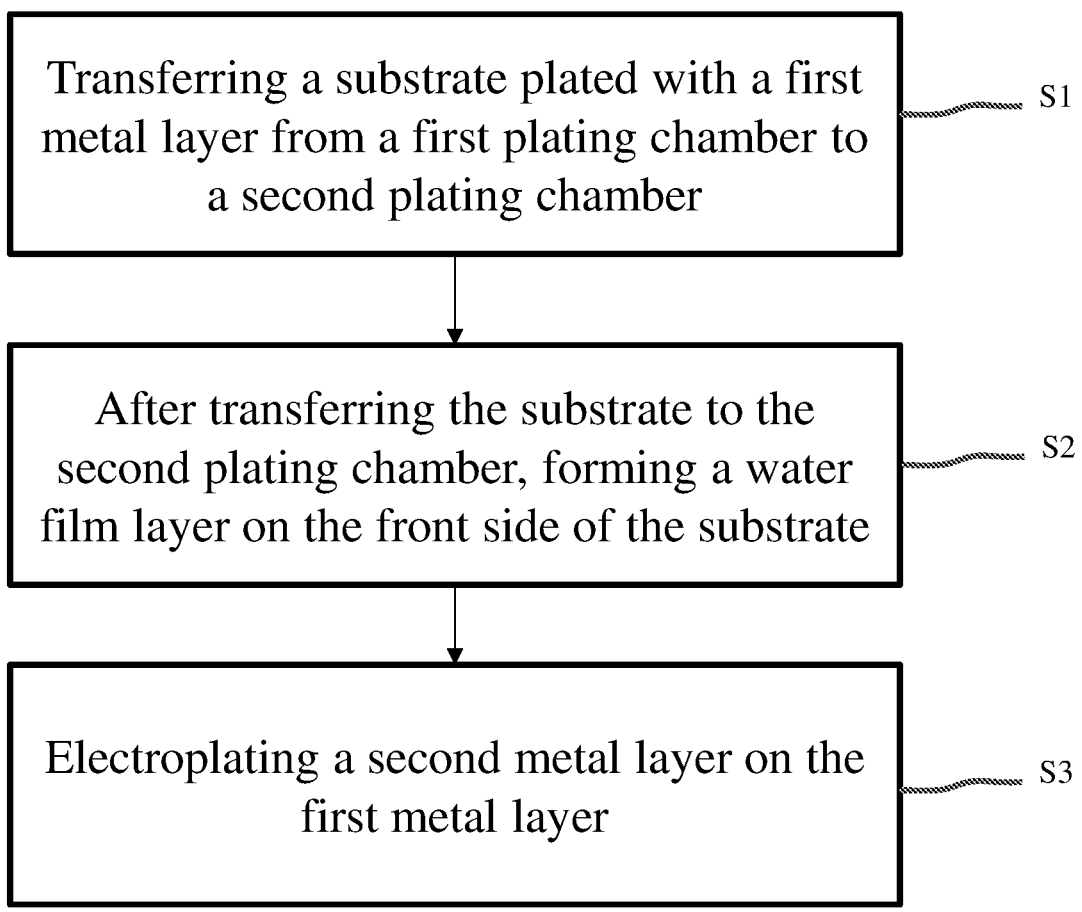
FIG. 1 shows a flow chart of a substrate processing method of the present invention.

The implementation of the present invention will be illustrated by specific examples below, and those skilled in the art can easily understand other advantages and effects of the present invention from the content disclosed in this specification. Although the description of the present invention will be presented in conjunction with a preferred embodiment, it does not mean that the features of the present invention are limited to this embodiment. On the contrary, the purpose of introducing the present invention in conjunction with the embodiments is to cover other options or modifications that may be extended based on the claims of the present invention. The following description contains numerous specific details in order to provide a thorough understanding of the present invention. The present invention may also be practiced without these details. Also, some specific details will be omitted from the description in order to avoid confusion or obscuring the gist of the present invention. It should be noted that, in the case of no conflict, the embodiments of the present invention and the features in the embodiments can be combined with each other.

It should be noted that in this specification, similar numerals and letters denote similar items in the following drawings, therefore, once an item is defined in one drawing, it does not need to be defined and explained in subsequent drawings.

The technical solutions of the present invention will be clearly and completely described below in conjunction with the accompanying drawings. Apparently, the described embodiments are some of the embodiments of the present invention, but not all embodiments. Based on the embodiments of the present invention, all other embodiments obtained by persons of ordinary skill in the art without making creative efforts belong to the protection scope of the present invention.

In the description of the present invention, it should be noted that the terms "center", "upper", "lower", "left", "right", "vertical", "horizontal", "inner", "outer" etc. indicate orientation or positional relationship that is based on the orientation or positional relationship shown in the drawings, and is only for the convenience of describing the present invention and simplifying the description, rather than indicating or implying that the referred device or element must have a specific orientation, or in a specific orientation. construction and operation, therefore, should not be construed as limiting the present invention. In addition, the terms "first", "second", and "third" are used for descriptive purposes only, and should not be construed as indicating or implying relative importance.

In the description of the present invention, it should be noted that unless otherwise specified and limited, the terms "installation", "connection" should be understood in a broad sense, for example, it can be a fixed connection or a detachable connection, or integrally connected; it can be mechanically connected or electrically connected; it can be directly connected or indirectly connected through an intermediary, and it can be the internal communication of two components. Those of ordinary skill in the art can understand the specific meanings of the above terms in the present invention in specific situations.

In order to make the purpose, technical solution and advantages of the present invention be clearer, the following will further describe the implementation of the present invention in detail in conjunction with the accompanying drawings.

Referring to FIG. 1, the present invention provides a substrate processing method comprising the following steps:
S1: transferring the substrate plated with a first metal layer from a first plating chamber to a second plating chamber;
S2: after transferring the substrate to the second plating chamber, forming a water film layer on the front side of the substrate;
S3: electroplating a second metal layer on the first metal layer.

In this embodiment, the first metal layer may be a copper layer or a nickel layer, and the second metal layer may be a nickel layer or a tin-silver layer.

In this embodiment, after the substrate enters the second plating chamber, a water film layer is firstly formed on the front side of the substrate plated with the first metal layer to eliminate the influence caused by the evaporation of moisture on the surface of the substrate during the transfer process, and then the second metal layer is electroplated on the upper surface of the first metal layer. At this time, the electroplating solution of the second metal layer is able to enter the patterns smoothly and fully contact with the first metal layer, and delamination between the second metal layer and the first metal layer is avoided. Therefore, the substrate processing method has the advantage of avoiding delamination between the two metal layers and solving the product recess abnormality through the step of forming the water film layer before electroplating.

In addition, in the embodiment, the water film layer is formed on the front side of the substrate after the substrate enters the second plating chamber, so there is no need to pre-wet the substrate in an additional pre-wetting chamber, and thus the process step of transferring the substrate from the pre-wetting chamber to the second plating chamber can be omitted, which is capable of saving the equipment space, shortening the process waiting time, and improving the production efficiency.

Figure 2:
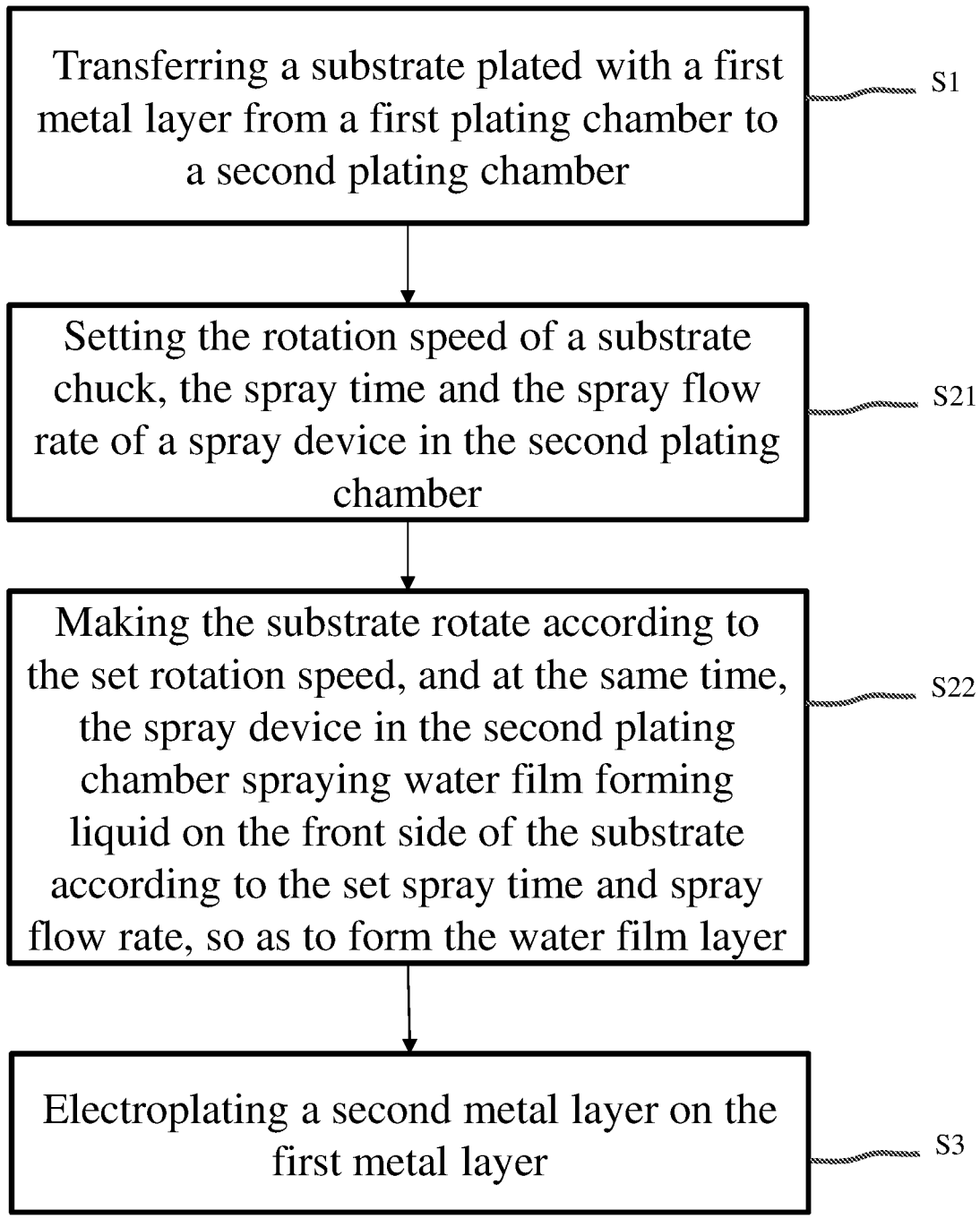
FIG. 2 shows another flow chart of a substrate processing method of the present invention.

Referring to FIG. 2, the above step S2 further comprises:
S21: setting the rotation speed of a substrate chuck, the spray time and the spray flow rate of a spray device in the second plating chamber. In this embodiment, the substrate chuck is used to clamp the substrate and bring the substrate to rotate. The rotation speed of the substrate chuck can be set to 100 rpm/min, 200 rpm/min, 300 rpm/min, etc. The spray time of the spray device can be set to 10 seconds and 20 seconds. The spray flow rate of the spray device can be set to 1.5 lpm/min. In addition, the step of setting the rotation speed of the substrate chuck, the spray time and the spray flow rate of the spray device is the first step in setting the parameters related to substrate processing in this embodiment, and the specific values can be set according to actual needs. The rotation speed of the substrate chuck, the spray time and the spray flow rate of the spray device are not specifically limited, as long as a water film layer can be formed on the front side of the substrate.
S22: making the substrate rotate according to the set rotation speed, and at the same time, the spray device in the second plating chamber spraying the water film forming liquid to the front side of the substrate according to the set spray time and the spray flow rate, so as to form the water film layer. In this embodiment, the spray device is the original cleaning assembly in the second plating chamber. The original cleaning assembly is used to clean the electroplating solution on the front side of the substrate after the substrate is electroplated. In this embodiment, the cleaning assembly is utilized to form a water film layer on the front side of the substrate to pre-wet the substrate before electroplating. The cleaning assembly has a cleaning nozzle, and the cleaning nozzle is used to spray the water film forming liquid on the front side of the substrate to form a water film layer on the front side of the substrate to pre-wet the substrate before electroplating. In addition, the water film forming liquid can be deionized water. The shape of the water film forming liquid ejected from the cleaning nozzle is fan-shaped, which can evenly cover the surface of the substrate. When the substrate rotates, a water film layer is formed on the area to be electroplated on the substrate.

In this embodiment, the spray device in the second plating chamber is used to spray the water film forming liquid on the front side of the substrate according to the preset spray time and spray flow rate. On the one hand, the electroplating solution residue of the previous electroplating process on the front side of the substrate can be cleaned to prevent cross-contamination; on the other hand, the formation of a water film layer can prevent the front side of the substrate from drying before electroplating, eliminating the adverse effects of water evaporation on the electroplating process.

By setting the corresponding spray flow rate, it is capable of avoiding the flow rate being too small, resulting in the electroplating solution residue on the surface of the substrate not being cleaned, resulting in cross-contamination; and at the same time, it is also capable of avoiding the spray flow rate being too large, resulting in not easy to form uniform water film layer.

By setting the corresponding rotation speed value, it is capable of avoiding the substrate rotation speed being too small, resulting in a large amount of falling water; and at the same time, it is also capable of avoiding the rotation speed being too large, resulting in drying the moisture on the surface of the substrate, which is not conducive to the formation of the water film layer.

Those skilled in the art can understand that, in other alternative embodiments, an additional spray device can be set in the second plating chamber to spray the water film forming liquid on the substrate, which can also save equipment space and shorten the process waiting time, improve the production efficiency.

Figure 3:
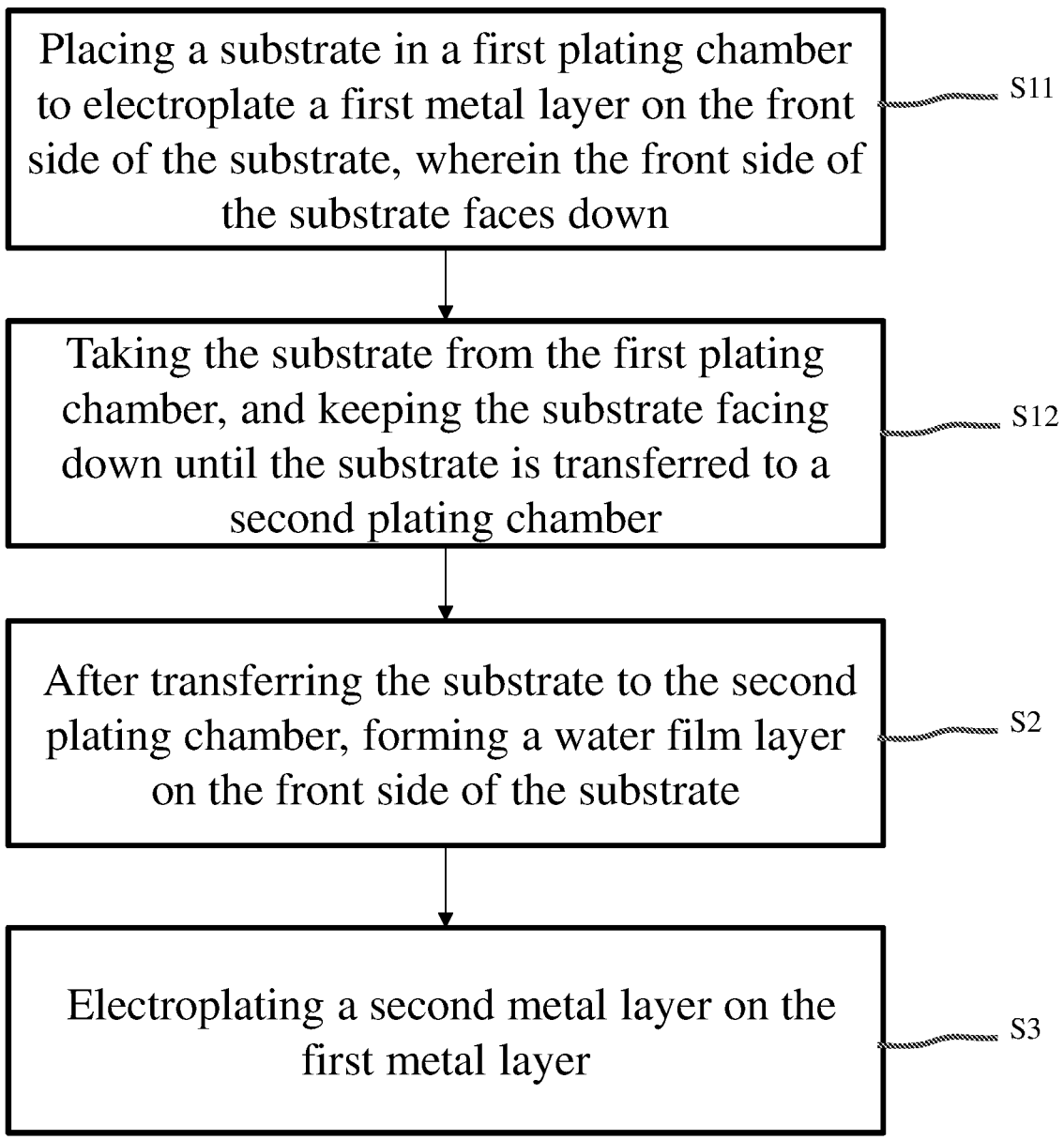
FIG. 3 shows another flow chart of a substrate processing method of the present invention.

Referring to FIG. 3, the above step S1 further comprises:
S11: placing the substrate in the first plating chamber to electroplate the first metal layer on the front side of the substrate, wherein the front side of the substrate faces down.
S12: taking the substrate from the first plating chamber, and keeping the front side of the substrate facing down until the substrate is transferred to the second plating chamber.

That is, during the transfer process of the substrate from the first plating chamber to the second plating chamber, the front side of the substrate is always facing the same direction.

After the first metal layer is electroplated on the front side of the substrate, before the substrate is taken out from the first plating chamber, the cleaning assembly in the first plating chamber is used to spray deionized water on the front side of the substrate to clean the front side of the substrate and prevent electroplating solution on the front side of the substrate enters the second plating chamber, affecting the electroplating process in the second plating chamber.

After the substrate electroplated with the first metal layer enters the second plating chamber, first, use the cleaning assembly in the second plating chamber to spray deionized water on the front side of the substrate to form a water film layer; then, electroplate the second metal layer; finally, after electroplating the second metal layer, use the cleaning assembly in the second plating chamber to spray deionized water on the front side of the substrate to clean the front side of the substrate and prevent the electroplating solution on the front side of the substrate from entering the third plating chamber and affecting the electroplating process in the third plating chamber.

The first plating chamber can be used for electroplating copper or nickel. The second plating chamber can be used for electroplating nickel, tin-silver or gold. The third plating chamber can be used for electroplating gold or tin-silver.

During the substrate transfer process, it takes a period of time from one plating chamber to another, and this time is called Q-time. If the Q-time is too long, it will not only cause the moisture on the surface of the substrate to evaporate easily, but also affect the productivity.

In the prior art, the process of transferring a substrate from one plating chamber to another plating chamber is as follows: when taking the substrate from one plating chamber, the substrate is flipped over so that the front side of the substrate is facing up, then the substrate is transferred, and when transferring the substrate to the other plating chamber, the substrate is flipped over again so that the front side of the substrate is facing down in order to proceed to the next step of the electroplating process. This results in a long Q-time of 50 s to 60 s.

Therefore, in this embodiment, the above-mentioned substrate transfer method is improved, so that during the transfer process of the substrate from the first plating chamber to the second plating chamber, the front direction of the substrate is always kept unchanged, thereby shortening the time (that is, Q-time) that the substrate is transferred from the first plating chamber to the second plating chamber, saving time and improving production efficiency.

Figure 4:
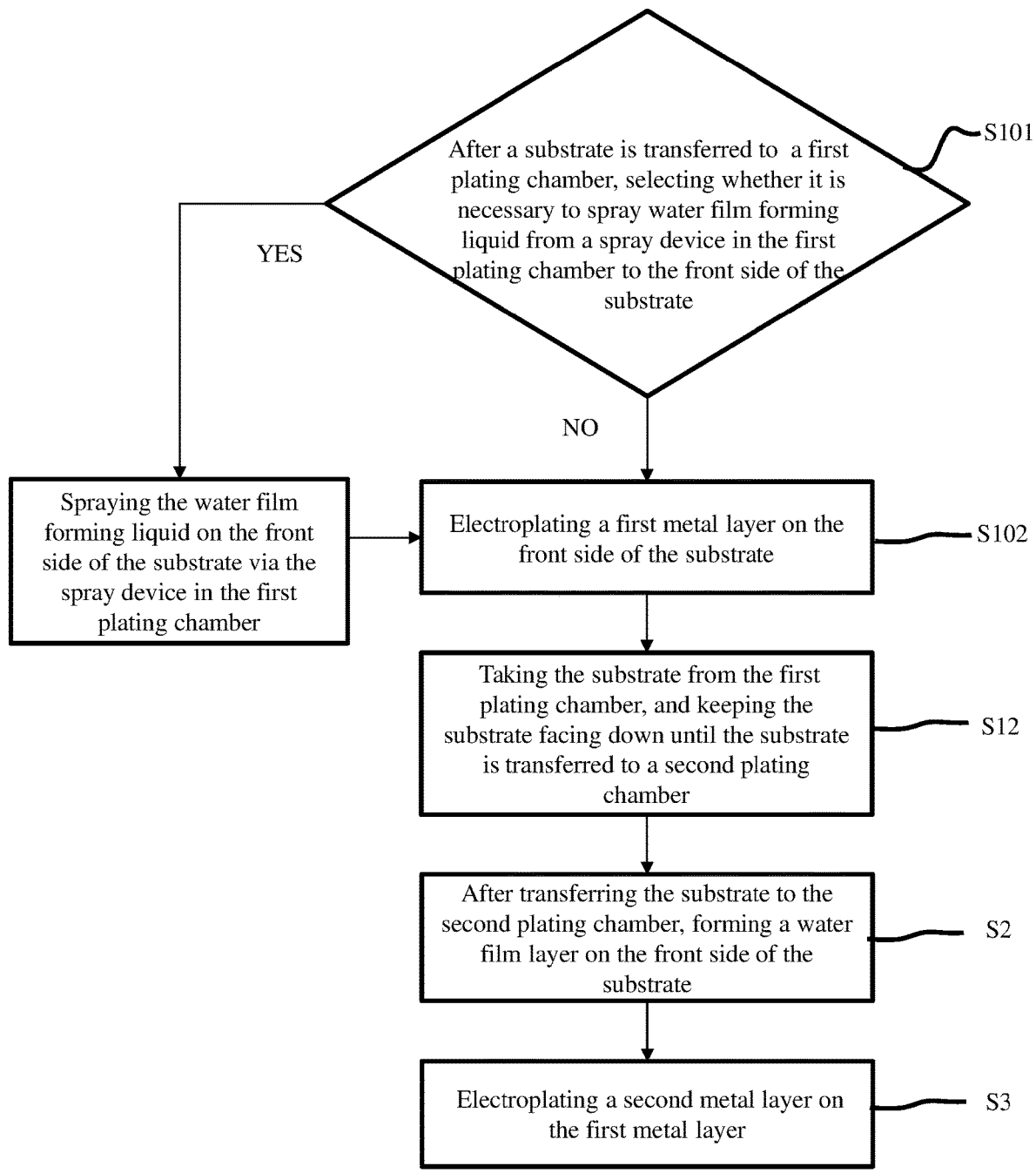
FIG. 4 shows another flow chart of a substrate processing method of the present invention.

Referring to FIG. 4, the step S11 further comprises:
S101: after the substrate is transferred to the first plating chamber, according to the actual process requirements, selecting whether it is necessary to spray the water film forming liquid from the spray device in the first plating chamber to the front side of the substrate, if necessary, the spray device in the first plating chamber sprays the water film forming liquid to the front side of the substrate, and then entering step S102, if not necessary, directly entering the step S102;
S102: electroplating the first metal layer on the front side of the substrate.

Wherein, the specific steps of spraying the water film forming liquid to the front side of the substrate via the spray device in the first plating chamber are similar to the steps of spraying the water film forming liquid to the front side of the substrate by the spray device in the second plating chamber (i.e. steps S21, S22) and will not be repeated here.

In this embodiment, a better electroplating effect can be ensured by selecting whether to spray the water film forming liquid from the spray device in the first plating chamber to the front side of the substrate according to actual process requirements.

Figure 5:
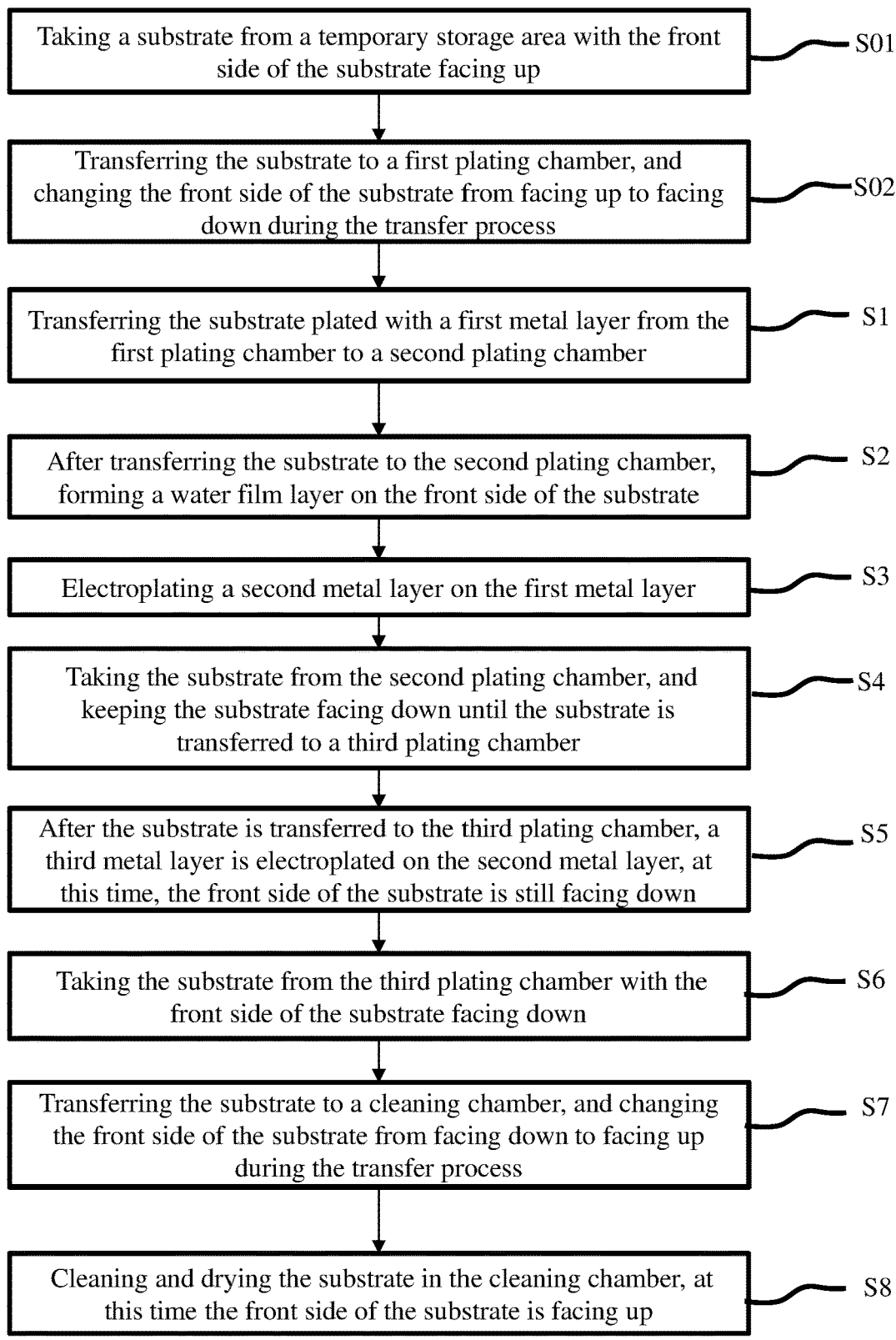
FIG. 5 shows another flow chart of a substrate processing method of the present invention.

Referring to FIG. 5, before the step S1, the substrate processing method further comprises:
S01: taking the substrate from a temporary storage area with the front side of the substrate facing up;
S02: transferring the substrate to the first plating chamber, and changing the front side of the substrate from facing up to facing down during the transfer process.

That is, during the transfer process of the substrate from the temporary storage area to the first plating chamber, the substrate is transferred in a state of flipping while transferring.

In the prior art, the substrate is flipped after arriving in the first plating chamber from the temporary storage area, not flipping while transferring, resulting in a long Q-time. In this embodiment, the transfer mode of flipping while transferring is adopted, so that the Q-time time is effectively shortened. The temporary storage area may be a pre-wetting chamber or a temporary storage area of the substrate after pre-wetting in the pre-wetting chamber.

Further, the substrate processing method further comprises the steps of:
S4: taking the substrate from the second plating chamber, and keeping the front side of the substrate facing down until the substrate is transferred to the third plating chamber.
S5: after the substrate is transferred to the third plating chamber, electroplating the third metal layer on the second metal layer, at this time, the front side of the substrate is still facing down.

In this embodiment, the existing substrate transfer method is improved, so that during the transfer process of the substrate from the second plating chamber to the third plating chamber, the front side of the substrate is always kept facing down, so that the Q-time is effective shorten.

Figure 6:
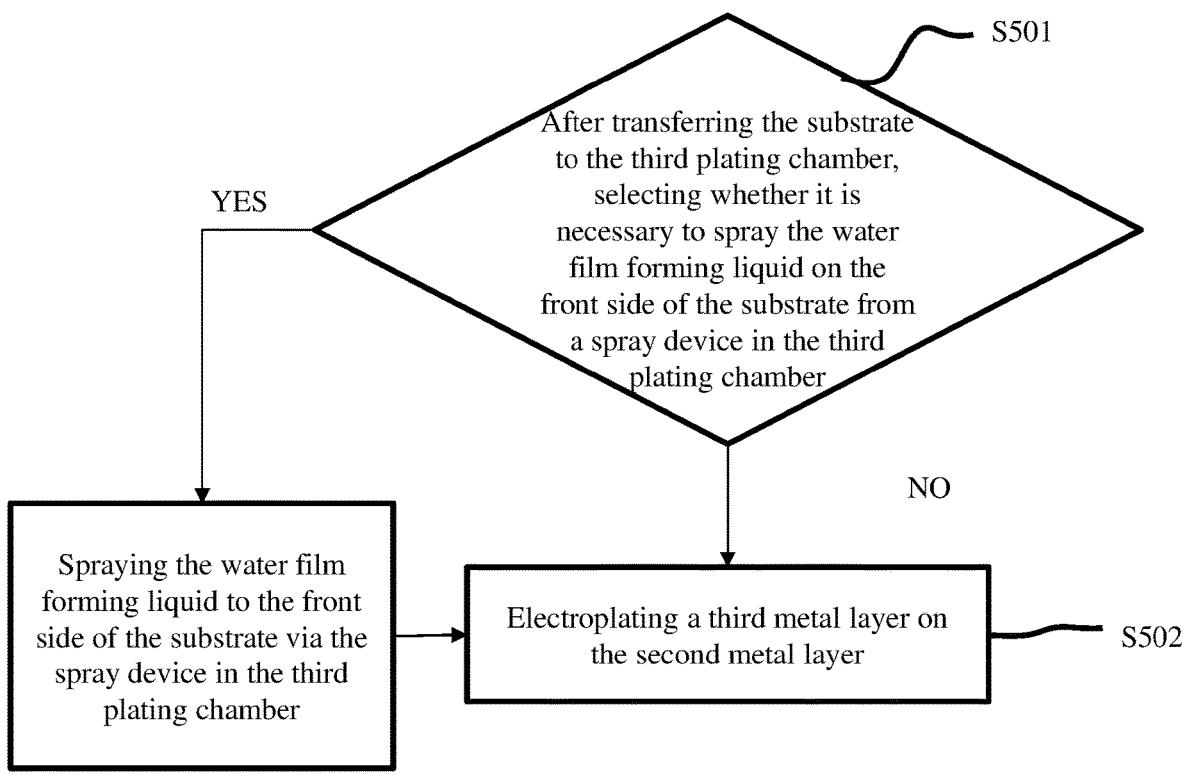
FIG. 6 shows a flow chart of step S5 of a substrate processing method of the present invention.

Referring to FIG. 6, the step S5 comprises:
S501: after transferring the substrate to the third plating chamber, according to the actual process requirements, selecting whether it is necessary to spray the water film forming liquid on the front side of the substrate from a spray device in the third plating chamber, if necessary, spraying the water film forming liquid to the front side of the substrate via the spray device in the third plating chamber, and then entering step S502, if not necessary, directly entering the step S502;

S502: electroplating a third metal layer on the second metal layer.

In this embodiment, the third metal layer may be a gold layer. In an actual electroplating process, it may select to spray the water film forming liquid or not to spray the water film forming liquid according to the actual process requirements. Wherein, the specific steps of spraying the water film forming liquid to the front side of the substrate via the spray device in the third plating chamber are similar to the steps of spraying the water film forming liquid to the front side of the substrate via the spray device in the second plating chamber (i.e. steps S21, S22) and will not be repeated here.

Further, as shown in FIG. 5, the substrate processing method further comprises the following steps:

S6: taking the substrate from the third plating chamber with the front side of the substrate facing down;

S7: transferring the substrate to a cleaning chamber, and changing the front side of the substrate from facing down to facing up during the transfer process;

S8: cleaning and drying the substrate in the cleaning chamber, and at this time the front side of the Substrate is facing up.

In the prior art, the substrate is turned over after arriving in the cleaning chamber from the third plating chamber to make the front side of the substrate face up, so as to clean and dry the substrate, resulting in a long Q-time. In this embodiment, during the transfer process of the substrate from the third plating chamber to the cleaning chamber, the transfer method of flipping while transferring is adopted to shorten the Q-time, for example, the time can be shortened from the previous 40 seconds to 30 seconds.

In this embodiment, multiple transfers and flipping of the substrate are realized by robots in the existing electroplating equipment.

Those skilled in the art can understand that in the electroplating process flow, it is possible to electroplate one layer, two layers, three layers, four layers of metal, or even more layers of metal. When four or more metal layers are electroplated, it can also set according to the actual process requirements whether or not it is necessary to form a water film layer by spraying the water film forming liquid to the front side of the substrate from a spray device in the corresponding plating chamber, so as to enable the electroplating solution to enter patterns more smoothly.

Finally, it should be noted that: the above embodiments are only used to illustrate the technical solutions of the present invention, rather than limiting them; although the present invention has been described in detail with reference to the foregoing embodiments, those of ordinary skill in the art should understand that: it is still possible to modify the technical solutions described in the foregoing embodiments, or perform equivalent replacements for some or all of the technical features; and these modifications or substitutions do not make the essence of the corresponding technical solutions out of the scope of the technical solutions of each embodiment of the present invention.

What is claimed is:

1. A substrate processing method, comprising:
   S1: transferring a substrate plated with a first metal layer from a first plating chamber to a second plating chamber;
   S2: after transferring the substrate to the second plating chamber, forming a water film layer on the front side of the substrate;
   S3: electroplating a second metal layer on the first metal layer.

2. The substrate processing method according to claim 1, wherein the step S2 comprises:
   S21: using a substrate chuck to clamp the substrate and bring the substrate to rotate, and using a spray device in the second plating chamber to spray water film forming liquid on the front side of the substrate to form the water film layer, and setting the rotation speed of the substrate chuck, the spray time and the spray flow rate of the spray device;
   S22: making the substrate rotate according to the set rotation speed, and at the same time, the spray device in the second plating chamber spraying the water film forming liquid on the front side of the substrate according to the set spray time and spray flow rate, so as to form the water film layer.

3. The substrate processing method according to claim 2, wherein the shape of the water film forming liquid ejected by the spray device is fan-shaped, and the water film forming liquid is deionized water.

4. The substrate processing method according to claim 1, wherein the step S1 comprises:
   S11: placing the substrate in the first plating chamber to electroplate the first metal layer on the front side of the substrate, wherein the front side of the substrate faces down;
   S12: taking the substrate from the first plating chamber, and keeping the front side of the substrate facing down until the substrate is transferred to the second plating chamber.

5. The substrate processing method according to claim 4, wherein the step S11 comprises:
   S101: after the substrate is transferred to the first plating chamber, selecting whether it is necessary to spray the water film forming liquid from a spray device in the first plating chamber to the front side of the substrate, if necessary, spraying the water film forming liquid to the front side of the substrate via the spray device in the first plating chamber, and then entering step S102, if not necessary, directly entering the step S102;
   S102: electroplating the first metal layer on the front side of the substrate.

6. The substrate processing method according to claim 1, wherein before the step S1, the method further comprises:
   S01: taking the substrate from a temporary storage area with the front side of the substrate facing up;
   S02: transferring the substrate to the first plating chamber, and changing the front side of the substrate from facing up to facing down during the transfer process.

7. The substrate processing method according to claim 1, further comprising the following steps:
   S4: taking the substrate from the second plating chamber, and keeping the front side of the substrate facing down until the substrate is transferred to a third plating chamber;
   S5: electroplating a third metal layer on the second metal layer after the substrate is transferred to the third plating chamber.

8. The substrate processing method according to claim 7, wherein the step S5 comprises:
   S501: after transferring the substrate to the third plating chamber, selecting whether it is necessary to spray the water film forming liquid on the front side of the substrate from a spray device in the third plating chamber, if necessary, spraying the water film forming liquid to the front side of the substrate via the spray device in the third plating chamber, and then entering step S502, if not necessary, directly entering the step S502;

S502: electroplating a third metal layer on the second metal layer.

9. The substrate processing method according to claim 7, further comprising the following steps:

S6: taking the substrate from the third plating chamber with the front side of the substrate facing down;

S7: transferring the substrate to a cleaning chamber, and changing the front side of the substrate from facing down to facing up during the transfer process;

S8: cleaning and drying the substrate in the cleaning chamber.

* * * * *